April 18, 1961 J. I. PANKOVE 2,980,594

METHODS OF MAKING SEMI-CONDUCTOR DEVICES

Filed June 1, 1954

INVENTOR.
JACQUES I. PANKOVE
BY J. L. Whittaker
ATTORNEY

United States Patent Office 2,980,594

Patented Apr. 18, 1961

2,980,594

METHODS OF MAKING SEMI-CONDUCTOR DEVICES

Jacques I. Pankove, Princeton, N.J., assignor to Radio Corporation of America, a corporation of Delaware Filed June 1, 1954, Ser. No. 433,619

6 Claims. (Cl. 204—32)

This invention relates to improved semi-conductor devices and methods of making them. More particularly it relates to semi-conductor devices such as large area rectifiers and transistors especially adapted for operation at relatively high electrical frequencies.

Semi-conductor devices such as crystal rectifiers and transistors include a base of a semi-conductive material, at least one rectifying electrode contacting the base and a substantially non-rectifying connection to the base. One of the important limiting parameters in the operation of such devices at high electrical frequencies, such as frequencies in excess of one megacycle per second, is the effective internal resistance between the non-rectifying connection and the rectifying electrode. In order to minimize this resistance it is generally desirable to place the non-rectifying contact on the base as closely as possible to the rectifying electrode. In transistor devices, which generally have two rectifying electrodes, it is also desirable accurately to space the electrodes one from another, and when they are placed upon opposite surfaces of a relatively thin base wafer it is desirable that they be accurately aligned.

One method of making a transistor device having relatively accurately spaced and aligned electrodes is described in an article by Tiley and Williams in The Proceedings of the I.R.E., volume 41, page 1706, December 15, 1953. This method comprises electroetching pits into opposite sides of a wafer of n-type germanium by means of an electrolyte jet and electroplating a metal upon the etched surfaces. The method described by Tiley and Williams, however, does not provide for placing a non-rectifying base connection closely adjacent to one or both of the rectifying electrodes. Further, their method is described only in connection with devices having bases of n-type semi-conductive material. Previous methods of making a non-rectifying contact closely adjacent to a rectifying electrode on a semi-conductor base have relied primarily upon the skill of an individual operator in making a solder connection without electrically short-circuiting the rectifying electrode.

In high frequency devices it is also often desirable to utilize a base of p-type instead of n-type semi-conductive material because the operation of such devices is largely dependent upon the diffusion of injected minority carriers in the base. In the case of n-type material the minority carriers are holes, whereas in p-type material the minority carriers are electrons. Electrons diffuse at a more rapid rate and have a greater mobility in most known semi-conductive materials than do holes. The transmission of a signal from one electrode of a semi-conductor device to another electrode may, therefore, be more rapidly accomplished if electron charge carriers are utilized than if hole charge carriers are utilized.

Accordingly, one object of the invention is to provide improved semi-conductor devices.

Another object is to provide improved methods of making semi-conductor devices.

Another object is to provide improved semi-conductor devices utilizing bases of either p-type or n-type semi-conductive material and being especially adapted for operation at relatively high electrical frequencies.

Another object is to provide improved semi-conductor devices comprising semi-conductor bodies having rectifying electrodes disposed on selected portions of their surfaces and non-rectifying connections upon other portions of their surfaces closely adjacent to the rectifying electrodes.

These and other objects are accomplished in accordance with the instant invention by utilizing improved successive electrolytic etching and electroplating steps to provide a semi-conductor device. Each step is controlled by means of a biasing potential placed across a barrier in a semi-conductor body. Briefly, according to one embodiment of the invention a rectifying contact is made to one surface of a wafer of p-type semi-conductive material and is biased in the reverse direction. The opposite surface of the wafer is electrolytically etched to form a pit or well, the shape of which is determined primarily by the potential across the barrier. The biasing potential is reversed to bias the contact in the forward direction and a rectifying electrode is electroplated in the pit. Because of the bias on the contact the electroplated material is primarily deposited at the bottom of the pit. A non-rectifying metal film is then plated over the remaining portion of the surface of the wafer to provide a large area non-rectifying connection to the wafer close to but spaced from the electroplated rectifying electrode.

According to a second embodiment of the invention a generally similar process is carried out utilizing a base of n-type semi-conductive material.

The invention will be described in greater detail in connection with the accompanying drawing of which:

Similar reference numerals are applied to similar elements throughout the drawing.

Figure 1:
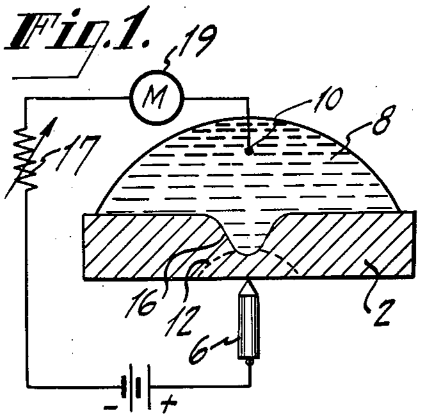
Figures 1–4 are schematic, cross-sectional, elevational views of a wafer of p-type germanium illustrating successive steps in making a device according to the invention.

A diode or a transistor device may be made according to the invention by the method steps illustrated by Figures 1–4. A wafer 2 of p-type semi-conductive germanium having a resistivity of about 1–3 ohm-cm. is cut to form a base about .085" x 0.1" x .010" thick. The wafer is prepared by etching it in a solution comprising hydrofluoric and nitric acids to reduce its thickness to about .005" and to expose a clean, crystallographically undisturbed surface.

A pit, or depression is etched into one surface of the wafer according to a method described and claimed in the co-pending application of Jerome Kurshan, Serial No. 434,945, filed concurrently herewith and assigned to the same assignee as the instant application and now abandoned. A point probe 6 is contacted to one of the large area facets of the wafer to form a rectifying barrier at its point of contact. A drop 8 of an etching electrolyte such as 0.1 normal sodium hydroxide is placed upon the facet of the wafer opposite the point probe. The electrolyte wets the surface of the germanium and is retained on the surface by surface tension forces. An electrolyzing electrode 10 which may be the tip of a fine copper wire is contacted to the electrolyte. An etching potential is applied between the electrode and the point probe to induce a current of a few milliamperes through the electrolyte and the wafer. This potential biases the point probe barrier in the reverse direction, i.e., the potential is in the direction of the barrier's greatest resistance. The etching voltage may be from about 3 volts up to 100 or more depending upon the electrical breakdown characteristics of the point probe barrier and the particular device that it is desired to produce. A typical value for the biasing potential is about 20 to 30 volts. The current is preferably limited by a resistor 17 of about 1000 ohms to avoid the possibility of harming the device by an overload. A current meter 19 may also be included in the circuit for monitoring purposes.

The potential gradient established in the wafer by the applied potential tends to accelerate the penetration of the etch into the wafer at a point on the etched surface directly opposite the rectifying probe. A pit, or well 16 is thus etched into the surface. When the etching penetrates into the wafer sufficiently to contact the edge of the Schottky layer, shown by the dotted line 12, a sudden increase in etching current occurs. The etching may be continued for a controlled length of time after the Schottky layer is contacted in order to deepen the etched pit and to sharpen its contours. It is preferred, however, to stop the etching immediately since further etching is relatively difficult to control. The etching may be stopped automatically at this point by including in the circuit a threshold type relay to open the circuit when the current reaches a predetermined value.

Figure 2:
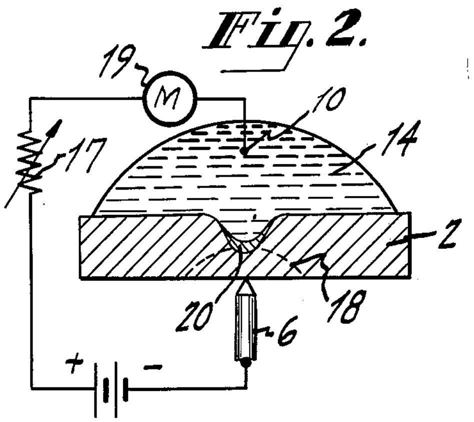

The etching electrolyte is then rinsed from the surface of the wafer and, according to the instant invention, is replaced by a metal plating solution 14, Figure 2, such as an acid solution of antimony trifluoride. The applied potential is reversed in polarity to bias the point probe barrier in its forward direction and to induce an electroplating current thereby to deposit metal from the solution onto the wafer. When it is biased in the forward direction the probe injects electrons into the wafer. These electrons are rapidly drawn to the bottom of the etched pit where they become a part of the electroplating current. The electroplated metal is preferentially deposited at the base of the etched pit both because of the relatively intense concentration of the injected electrons there and because the forward bias on the probe extends an electric field, of which one negative equipotential surface is indicated by the dotted line 18, into the wafer. The field renders the base of the pit more negative than the side walls of the pit and the surface of the wafer adjacent to the pit. Relatively little metal, therefore, is electroplated upon the upper side walls of the pit and upon the surface of the wafer beyond the pit.

Figure 3:
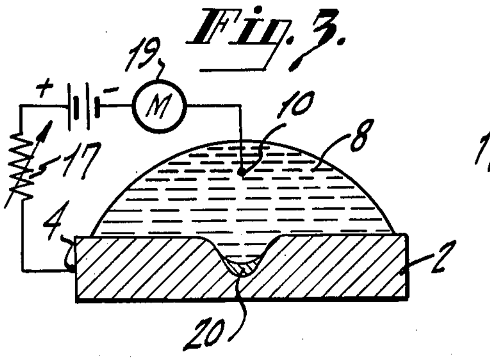

When the plating has proceeded to an extent sufficient to build up a film of metal 20 about .001–.003" thick at the base of the pit the plating solution is rinsed off and replaced with the etching electrolyte 8. An etching potential is applied as shown in Figure 3 between the electrolyzing electrode and the lead 4 which makes a non-rectifying connection to the wafer. The wafer is etched until substantially all electroplated metal is removed from the side walls of the etched pit and from the flat surface of the etched wafer adjacent to the etched pit. An isolated electroplated electrode 20 is thus formed at the base of the etched pit.

Figure 4:
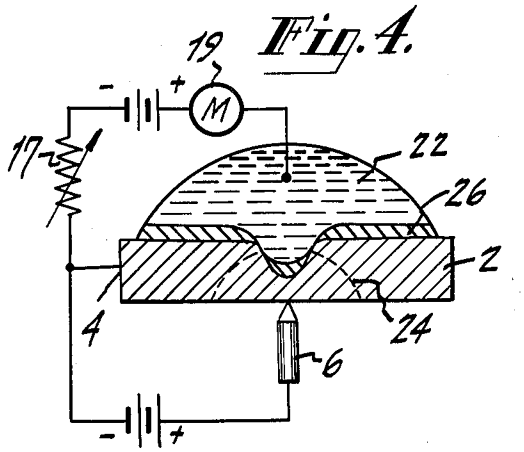

The etching solution is rinsed off and replaced with a second plating solution 22, Figure 4. The second plating solution comprises ions of a metal such as copper that will form a substantially non-rectifying contact when plated upon and fused to p-type germanium. The solution is made relatively dilute to increase its resistivity so that it will not effectively short circuit the potential difference established between different parts of the semi-conductor surface. The point probe is biased in the reverse direction with a potential at least sufficiently large to extend the Schottky layer to contact the electroplated electrode at the base of the pit. An electroplating potential is applied between the wafer and the electrolyzing electrode and metal from the plating solution is electrodeposited over a relatively large area of the wafer. Due to the Schottky layer effect the biasing potential establishes an equipotential surface indicated schematically by the dotted line 24 that intersects the walls of the pit and prevents the deposition of the plated metal upon the previously electroplated electrode 20 and upon a relatively small area adjacent to the electrode. There is thus formed a metallic film 26 upon the surface of the wafer close to but separated from the electroplated rectifying electrode. The device is rinsed and dried, and electrical leads are connected to the electrode and to the plated film.

If desired, the device may be heated at about 300° C. for about five minutes to diffuse the copper film into the wafer to reduce the rectifying characteristics of the film. The point probe may be left in place and the device utilized as a transistor. Alternatively, the probe may be removed or disconnected and the device may be utilized as a high frequency crystal rectifier. In either case, the close proximity of the metal film to the rectifying electroplated electrode enhances the performance of the device and minimizes electrical losses that ordinarily occur in previous devices wherein the spacing between the non-rectifying contact and the rectifying contact is relatively great.

Figure 5:
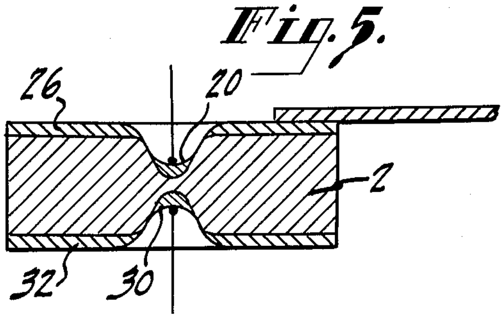
Figure 5 is a schematic, cross-sectional, elevational view of another device according to the invention.

According to a second embodiment of the invention the device shown in Figure 4 may be further treated to form the transistor device of Figure 5 which includes two opposite, aligned, closely-spaced, electroplated electrodes 20 and 30 with a base connection 26 and 32 in close proximity to each electrode. To form this device the point probe shown in Figure 4 is removed and an electrical contact is made by a low temperature solder connection or by pressure to the electroplated electrode. The device is inverted and the process heretofore described is repeated on a second side of the wafer with the electroplated electrode taking the place of the point probe.

The foregoing embodiments of the invention are not limited to the specific materials and devices heretofore described. Any p-type crystalline semi-conductive material may be utilized in place of germanium such as, for example, silicon, aluminum antimonide and indium phosphide. The electroplated rectifying electrodes need not be of antimony but may be of any metal that forms a rectifying contact when plated upon the surface of the p-type semi-conductor. For example, cadmium, bismuth and silver are all suitable electrode materials when electroplated on p-type semi-conductive germanium or silicon.

One feature of the invention is the improved method of making a non-rectifying connection to the surface of a p-type semi-conductive body by depositing a highly conductive film upon the surface closely adjacent to but isolated from an electrode on the same surface. In this connection the electrodes need not be large area, electroplated electrodes such as those heretofore described but may be any known type. For example, a point contact or an alloy type electrode may be utilized in place of an electroplated electrode. It is desirable, however, to place the electrode at the bottom of a depression or pit. Because of the convex shape of the Schottky layer, the process is more easily controlled when the electrode is placed at the base of a relatively sharp pit and the non-rectifying contact is electroplated upon the surface surrounding the pit.

Another feature of the invention is the method of controllably electroplating an electrode or other connection at the bottom of a pit in a p-type semi-conductive body. As heretofore described the electroplating is controlled to deposit metal principally at the base of the pit rather than upon other surfaces of the body in contact with the electrolyte.

There have thus been described improved semi-conductor devices and methods of making them, which devices include semi-conductive bodies having rectifying electrodes in contact with them and non-rectifying connections closely adjacent to but separate from the electrodes.

What is claimed is:

1. A method of making a non-rectifying electrical connection to a p-type conductive body, comprising the steps of electroplating a rectifying electrode on one surface of said body, contacting a metal ion-bearing solution to said surface, said metal being one capable of forming a non-rectifying contact when electroplated upon said semi-conductive material, establishing an electroplating potential between said solution and said body to cause said metal to be deposited upon said surface, establishing a rectifying barrier upon a second surface of said body opposite said electrode, and biasing said barrier in the reverse direction thereby to prevent the deposition of said metal upon said electrode and upon a selected portion of said surface adjacent to said electrode.

2. A method of making a non-rectifying electrical connection to a p-type semi-conductive body, comprising the steps of electroplating a rectifying electrode on one surface of said body, contacting a metal ion-bearing solution to said surface, said metal being capable of producing p-type conductivity in said body when dispersed therein, establishing an electroplating potential between said solution and said body thereby to deposit a film of said metal upon said surface, establishing a rectifying barrier upon a second surface of said body opposite said electrode, biasing said barrier in the reverse direction thereby to prevent the deposition of said metal upon said electrode and upon a selected portion of said one surface adjacent to said electrode, and heating said body to diffuse a portion of said deposited metal film into a surface of said body.

3. A method of making a non-rectifying electrical connection to a body of a p-type semi-conductive material selected from the group consisting of germanium and silicon, comprising the steps of electroplating a rectifying electrode on one surface of said body, contacting a copper ion-bearing solution to said surface, establishing an electroplating potential between said solution and said body thereby to deposit a copper lamina upon said surface, establishing a rectifying barrier upon a second surface of said body opposite said electrode, biasing said barrier in the reverse direction thereby to prevent the deposition of copper upon said electrode and upon a selected portion of said one surface adjacent to said electrode, and heating said body at about 300° C. to diffuse a portion of said copper lamina into said body.

4. A method of making a non-rectifying electrical connection to a body of a p-type semi-conductive material selected from the group consisting of germanium and silicon, comprising the steps of electroplating a rectifying electrode on one surface of said body, contacting a copper ion-bearing solution to said surface, applying an electric potential between said solution and said surface thereby to electroplate copper upon said surface, establishing a rectifying barrier upon a second surface of said body opposite said electrode, and biasing said barrier in the reverse direction thereby to prevent the deposition of said copper upon said electrode and upon a selected portion of said one surface adjacent to said electrode.

5. A method of making a semi-conductor device including a base of p-type semi-conductive material comprising the steps of establishing a rectifying barrier upon a first surface of said body, biasing said barrier in the reverse direction, contacting an electrolyte to a second surface of said body opposite said first surface, applying an etching potential between said electrolyte and said body thereby to etch a shaped depression into said second surface, contacting a metal ion-bearing electrolyte to said second surface, said metal being one that forms a rectifying contact when electroplated upon said semi-conductive material, biasing said barrier upon said first surface in a forward direction and applying an electroplating potential between said electrolyte and said body thereby to deposit said metal upon said second surface at the base of said depression, etching said second surface thereby to reduce the thickness of said deposited metal and to remove said deposited metal from predetermined portions of said surface, contacting said second surface with an electroplating electrolyte, said electroplating electrolyte comprising ions of a metal capable of imparting p-type conductivity to said semi-conductive material when dispersed therein, biasing said barrier upon said first surface in a reverse direction and applying an electroplating potential between said body and said electroplating electrolyte thereby to deposit a metal lamina upon said second surface, said lamina being closely adjacent to and separated from said electrode.

6. A method of making a non-rectifying electrical connection to a p-type semiconductive body, comprising the steps of forming a rectifying electrode on one surface of said body, contacting a metal ion-bearing solution to said surface, said metal being one capable of forming a non-rectifying contact when electroplated on semiconductor material, establishing an electroplating potential between said solution and said body to cause said metal to be deposited upon said surface, establishing a rectifying barrier upon a second surface of said body opposite said electrode, and biasing said barrier in the reverse direction thereby to prevent the deposition of said metal upon said electrode and upon a selected portion of said surface adjacent to said electrode.

References Cited in the file of this patent

UNITED STATES PATENTS

| | | |
|---|---|---|
| 2,313,756 | Loose | Mar. 16, 1943 |
| 2,457,061 | McQuire | Dec. 21, 1948 |
| 2,560,579 | Knock et al. | July 17, 1951 |
| 2,563,503 | Wallace | Aug. 7, 1951 |
| 2,656,496 | Sparks | Oct. 20, 1953 |
| 2,694,040 | Davis et al. | Nov. 9, 1954 |
| 2,714,566 | Barton et al. | Aug. 2, 1955 |
| 2,725,505 | Webster et al. | Nov. 29, 1955 |
| 2,735,050 | Armstrong | Feb. 14, 1956 |
| 2,846,346 | Bradley | Aug. 5, 1958 |
| 2,912,371 | Early | Nov. 10, 1959 |

OTHER REFERENCES

Tiley et al.: Proceedings of the I.R.E., December 1953, pp. 1706–8.